US012733142B2

(12) United States Patent
Syrjänen

(10) Patent No.: US 12,733,142 B2
(45) Date of Patent: Sep. 8, 2026

(54) SHIELDED ELECTRONIC COMPONENT

(71) Applicant: MURATA MANUFACTURING CO., LTD., Nagaokakyo (JP)

(72) Inventor: Teppo Syrjänen, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 106 days.

(21) Appl. No.: 18/782,628

(22) Filed: Jul. 24, 2024

(65) Prior Publication Data

US 2024/0381598 A1 Nov. 14, 2024

Related U.S. Application Data

(63) Continuation of application No. 17/693,847, filed on Mar. 14, 2022, now Pat. No. 12,075,603.

(30) Foreign Application Priority Data

Mar. 18, 2021 (FI) ..................................... 20215296

(51) Int. Cl.
*H05K 9/00* (2006.01)

(52) U.S. Cl.
CPC ................................. *H05K 9/0007* (2013.01)

(58) Field of Classification Search
None
See application file for complete search history.

(56) References Cited

U.S. PATENT DOCUMENTS

| | | | | |
|---|---|---|---|---|
| 6,218,610 | B1 * | 4/2001 | Suzuki | H05K 9/003 174/394 |
| 7,295,083 | B2 * | 11/2007 | Kimata | H05K 9/0026 361/818 |
| 11,488,880 | B2 | 11/2022 | Nair | |
| 2004/0124194 | A1 | 7/2004 | Beizai | |
| 2004/0240191 | A1 * | 12/2004 | Arnold | H01L 23/04 257/E23.079 |
| 2005/0045358 | A1 * | 3/2005 | Arnold | H01L 23/295 174/51 |
| 2009/0146268 | A1 | 6/2009 | Huang et al. | |

(Continued)

FOREIGN PATENT DOCUMENTS

| | | | |
|---|---|---|---|
| CN | 105489593 | A | 4/2016 |
| JP | 2006-242590 | A | 9/2006 |

(Continued)

OTHER PUBLICATIONS

Search Report dated Aug. 2, 2022 corresponding to European Patent Application No. 22156752.

(Continued)

*Primary Examiner* — James Wu
*Assistant Examiner* — Christopher L Augustin
(74) *Attorney, Agent, or Firm* — SQUIRE PATTON BOGGS (US) LLP

(57) ABSTRACT

An electronic component comprising a package base and an at least partly metallic cap which is attached to the package base to form an enclosure. A metallic sheet is fixed to the package base. The metallic sheet comprises a sheet side section and the cap comprises a cap side section. The sheet side section is in contact with the cap side section so that they together form a side-shield on the side of the enclosure.

10 Claims, 10 Drawing Sheets

(56) References Cited

U.S. PATENT DOCUMENTS

2012/0320558 A1 12/2012 Foster et al.
2015/0279789 A1 10/2015 Mahajan et al.
2016/0300781 A1 10/2016 Xue et al.
2017/0325366 A1 11/2017 Li et al.

FOREIGN PATENT DOCUMENTS

JP 2015-141904 A 8/2015
JP 2016-201538 A 12/2016

OTHER PUBLICATIONS

Finnish Search Report dated Oct. 29, 2021 corresponding to Finnish Patent Application No. 20215296.
Notice of Reasons for Refusal dated Apr. 4, 2023 corresponding to Japanese Patent Application No. 2022-031062, with English translation thereof.
Notice of Reasons for Refusal issued in corresponding Japanese Patent Application No. 2022-031062 mailed Sep. 12, 2023, with English language translation thereof.

* cited by examiner

SHIELDED ELECTRONIC COMPONENT

CROSS-REFERENCE TO RELATED APPLICATIONS

This is a continuation application of U.S. patent application Ser. No. 17/693,847, filed on Mar. 14, 2022, which claims priority from Finnish Patent Application No. 20215296, filed on Mar. 18, 2021. The contents of these prior applications are hereby incorporated by reference in their entirety.

FIELD OF THE DISCLOSURE

The present disclosure relates to shielding of an electronic chip, and more particularly to shielding the chip from electromagnetic radiation generated outside of the component.

BACKGROUND OF THE DISCLOSURE

Electronic components typically comprise at least one electronic chip and a package. The chip is mounted inside the component package and may be electrically connected to external devices with electric pins which extend out of the package. The package of the electronic component provides mechanical protection for the electronic chip. But many electronic chips are also sensitive to electromagnetic radiation, so one objective of component design is often to shield the chip from external radiation.

It is known that a metallic cap can shield a chip from the top, but chips typically have no shielding from the side direction.

BRIEF DESCRIPTION OF THE DISCLOSURE

The object of the disclosure is achieved by an arrangement which is characterized by what is stated in the independent claim. The preferred embodiments of the disclosure are disclosed in the dependent claims.

The disclosure is based on the idea of implementing a metallic sheet in the base of a component and joining that sheet to an at least partly metallic cap on at least one side of the component. An advantage of this arrangement is that the chip inside the component can be shielded from external electromagnetic radiation from the top, bottom and side directions.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1A:
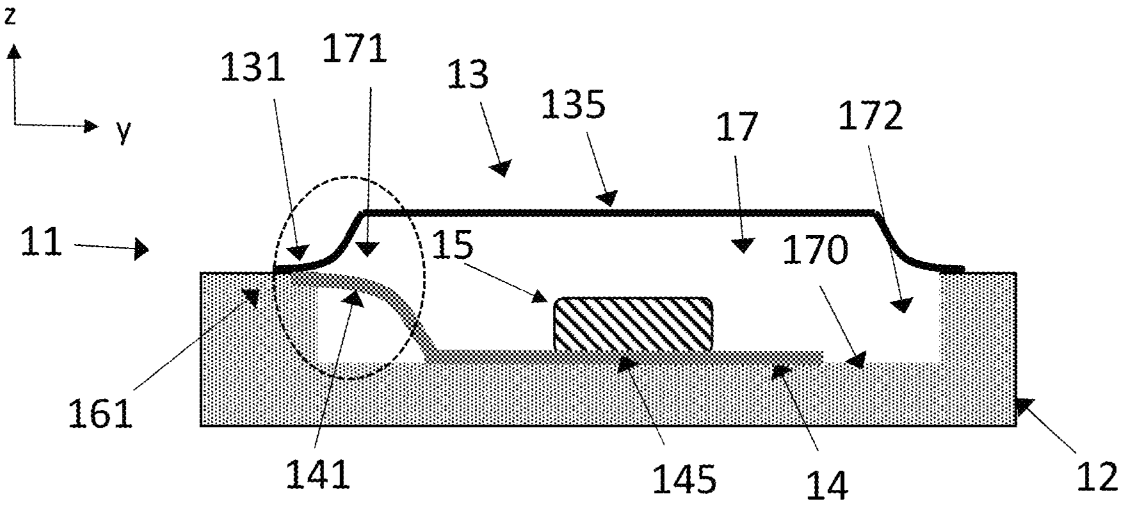
FIG. 1*a* illustrates an electronic component which is shielded from the top, bottom and one side.

This disclosure describes an electronic component comprising a package base and a cap which is attached to the package base to form an enclosure. The enclosure extends in a first direction and in a second direction which is orthogonal to the first, and the electronic component comprises at least one electronic chip which is mounted within said enclosure. The electronic chip has a chip length in the first direction and a chip width in the second direction.

The electronic component comprises a metallic sheet which is fixed to the package base. The metallic sheet comprises a first sheet side section on a first side of the enclosure and a central sheet section which underlies the electronic chip. The metallic sheet extends in the first direction from the first sheet side section to the central sheet section.

The cap comprises a metallic cap section. The metallic cap section comprises a first cap side section on the first side of the enclosure and a central cap section which overlies the electronic chip. The metallic cap section extends in the first direction from the first cap side section to the central cap section.

The first sheet side section is in contact with the first cap side section so that the first sheet side section and first cap side section together form a first side-shield on the first side of the enclosure.

In any embodiment of this disclosure, the widths of the central sheet section, the central cap section, and the first side-shield in the second direction may for example be between 40-60% of the chip width. Alternatively, these widths may in any embodiment of this disclosure be greater than 10%, greater than 20%, greater than 30% or greater than 40% of the chip width, or between 10% and 150% of the chip width. Furthermore, these three widths may also differ from each other in any embodiment of this disclosure, so that a first option described in this paragraph applies to the width of the central sheet section, a second option described in this paragraph applies to the width of the central cap section, and a third option described in this paragraph applies to the width of the first side-shield.

In this disclosure, the term "electronic chip" refers to an unencapsulated electronic device, while "electronic component" refers to a device where an electronic chip has been encapsulated. The electronic component has an enclosure which provides protection from the surrounding environment. The electronic chip may be mounted on a circuit board inside the enclosure. The circuit board thereby forms a chip-mounting surface which may also contain control circuits required by the chip. Wires may be drawn from the circuit board or from the chip itself to contact pins which extend to the outside of the electronic component to facilitate electrical access. The electronic component may itself be mounted onto a larger circuit board. The electronic chip may for example be a microelectromechanical (MEMS) chip.

In any embodiment presented in this disclosure, the cap may be a continuous metal structure which comprises a metal sheet and forms the metallic cap section. The metal structure may be shaped into a desired shape by pressing and/or bending the sheet. This metallic cap may consist of a metallic material, which may for example be aluminium, copper, stainless steel or an aluminium or copper compound. Alternatively, the cap may comprise an insulating sheet which is fully or partly coated with a metallic coating. The metallic cap section is in this case the section of the insulating sheet which is coated with the metallic coating. The insulating sheet may for example comprise a polymer foil, polymer film or plastic body. The metallic coating may comprise any of the metallic materials mentioned in the previous paragraph.

The package base may for example be formed by a moulded polymer. The metallic sheet which may be fixed to the package base by being at least partly embedded in the package base. The metallic sheet may be formed by a leadframe around which the package base has been moulded, so that the sheet becomes fully or partly embedded in the package base. The same leadframe may be used to form the external contact pins of the electronic component.

The metallic sheet may alternatively be fixed to the package base for example by attaching it with an adhesive. The metallic sheet may in this case be formed as a separate part and attached to the package base when the structure which forms the package base has already been manufactured.

The metallic sheet may, but does not necessarily have to, serve as a die pad which is used as the chip-mounting surface. The metallic sheet could alternatively be formed by a polymer film, polymer foil or plastic body which has been coated with one of the metallic materials mentioned above.

In the figures of this disclosure, the bottom surface of the enclosure defines an xy-plane and the z-axis is perpendicular to this xy-plane. Expressions such as "down", "up", "above" "below" and "vertical" correspond to the direction of z-axis illustrated in the figures, which points in the "up" direction. These expressions do not imply anything about how the component should be oriented during use or manufacture. The electric component could for example be mounted on an external circuit board in an "upside down" position where the illustrated "up" direction points towards the surface of the circuit board. That circuit board could in turn be oriented in any manner when it is mounted. In other words, the expressions discussed in this paragraph merely define two opposing directions.

In the xy-plane the enclosure extends in a first direction is indicated by the y-axis and in a second direction by the x-axis. In the first direction the enclosure extends from a first side to a second side, and in the second direction the enclosure extends from a third side to a fourth. The enclosure is illustrated with a rectangular shape in the figures, but it could alternatively have any other shape.

FIG. 1*a* illustrates an electronic component 11 with a package base 12 and a cap 13. The cap 13 is placed on top of the base 12 so that a sealed enclosure 17 is formed inside the component 11. At least one electronic chip 15 is placed within the enclosure 17. The package base 12 comprises a metallic sheet 14 which underlies the chip 15. In FIG. 1*a* the metallic sheet has been placed on the floor 170 of the enclosure 17. The chip 15 has been mounted on the metallic sheet 14. An insulating mounting surface (not illustrated) may alternatively be placed between the chip 15 and the metallic sheet 14.

The metallic sheet has a first sheet side section 141 on a first side 171 of the enclosure and a central sheet section 145 which underlies the electronic chip 15. The metallic sheet 14 extends in the first direction from the first sheet side section 141 to the central sheet section 145. The xy-cross section shown in FIG. 1*a* also illustrates the metallic section in the cap which comprises a central cap section 135 and a first cap side section 131 on the first side 171 of the enclosure. The metallic section in the cap extends in the first direction at least from the first cap side section 131 to the central cap section 135, and it may extend also to the second side 172 of the enclosure.

The first sheet side section 141 may extend toward the cap 13, and the first cap side section 131 may correspondingly extend downward toward the metallic sheet 14. The first sheet side section 141 may be joined to the first cap side section 131 at a vertical level which lies somewhere between the vertical level of the central sheet section 145 and the vertical level of the central cap section 135. The first sheet side section 141 may be joined to the first cap side section 131 for example by soldering, sintering, welding or with an adhesive, for example a conductive adhesive. The first sheet side section 141 and the first cap side section 131 are illustrated with curved shapes in this disclosure. They could alternatively extend in the vertical direction, and both sections may have a horizontal joining surface which allows them to be more firmly attached to each other. These considerations on the first sheet side section and first cap side section apply also to all other sheet side sections and cap side sections discussed in this disclosure.

The first sheet side section 141 and the first cap side section 131 together form a first side-shield 161 on the first side 171 of the enclosure 17. The side-shield 161 protects the electronic chip 15 from electromagnetic radiation which is incident from the left side of the figure. The central cap section 135 and the central sheet section 145 shield the chip 15 from electromagnetic radiation incident from above and below, respectively, as do the rest of the metallic section of the cap and the rest of the metallic sheet 14.

Figure 1B:
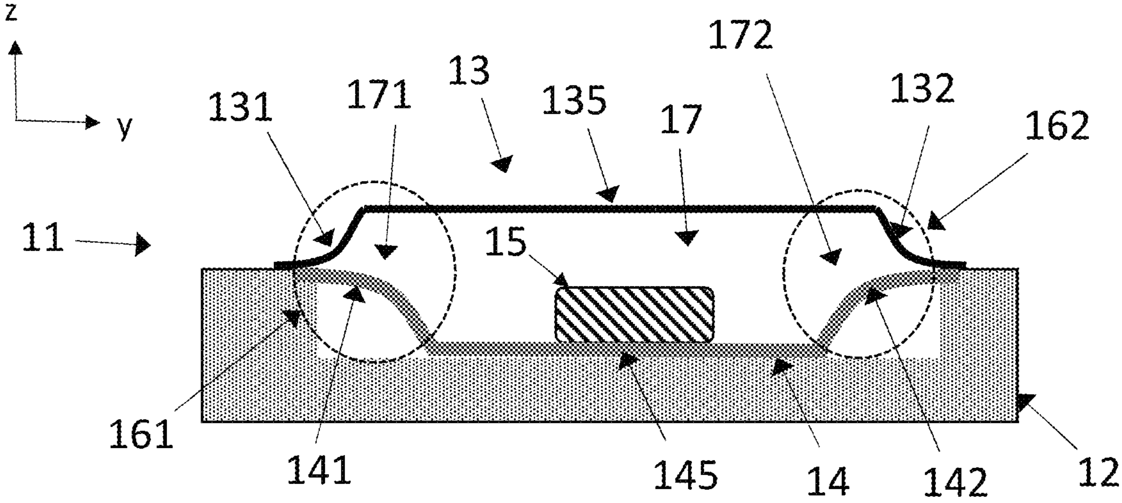
FIG. 1*b* illustrates an electronic component which is shielded from the top, bottom and two sides.

FIG. 1*b* illustrates an alternative embodiment where the metallic sheet 14 also comprises a second sheet side section 142 on a second side 172 of the enclosure 17. The metallic sheet 14 thereby extends in the first direction from the second sheet side section 142 to the central sheet section 145. The metallic cap section comprises a second cap side section 132 on the second side 172 of the enclosure 17, and the metallic cap section extends in the first direction from the second cap side section 132 to the central cap section 135. The second sheet side section 142 is in contact with the second cap side section 132 so that the second sheet side section 142 and second cap side section 132 together form a second side-shield 162 on the second side 172 of the enclosure 17.

The width of the second side-shield 162 in the second direction (the x-direction) may for example be between 40%-60% of the chip width. Alternatively, this width may in any embodiment of this disclosure be greater than 10%, greater than 20%, greater than 30% or greater than 40% of the chip width, or between 10% and 100% of the chip width.

Figure 1C:
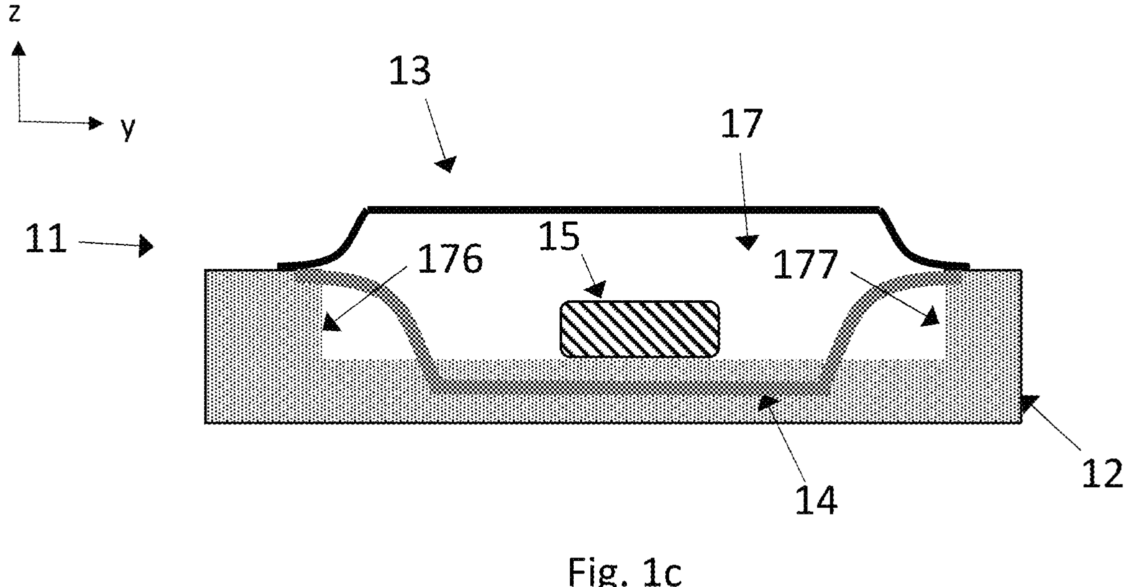
FIG. 1*c* illustrates an electronic component where the metallic sheet is partly embedded in the package base.

The side-shield 162 then protects the electronic chip 15 from electromagnetic radiation which is incident from the right side of the figure. In FIGS. 1*a* and 1*b* the horizontal part of the metallic sheet 14 lies on the floor 170 of the enclosure 17. As mentioned above, the metallic sheet can be fixed to the package base for example by embedding it in the package base or by attaching it to the surface of the package base. Either of these methods could be used to prepare the configuration shown in FIGS. 1*a* and 1*b*, FIG. 1*c* illustrates an alternative configuration where the metallic sheet 14 underlies the chip 15 but is not on the floor 170 of the enclosure 17. Instead the metallic sheet 14 is partly embedded in the package base 12. The chip 15 may be mounted on a separate mounting surface (not illustrated) within the enclosure 17.

Figure 1D:
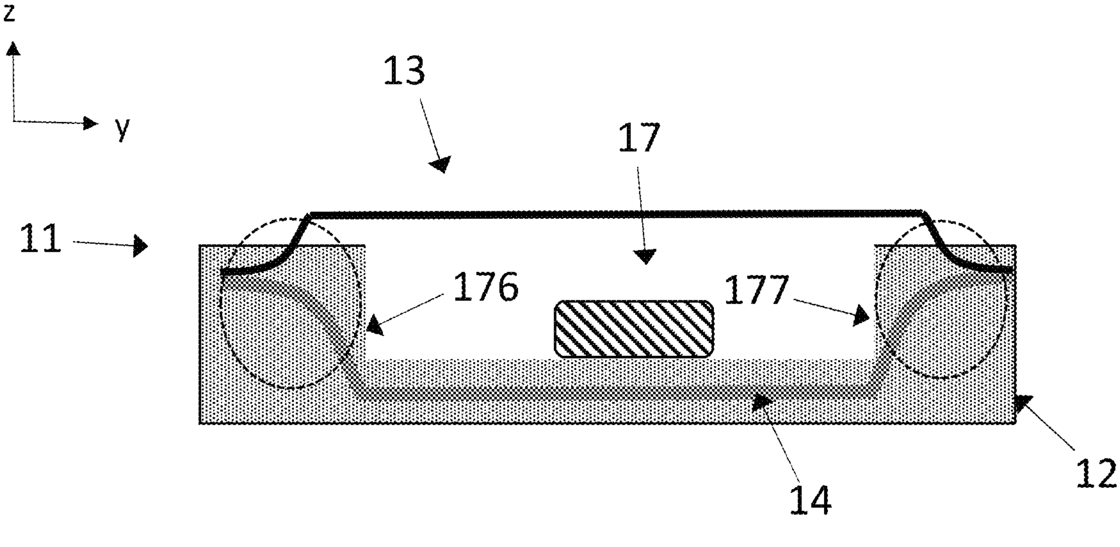
FIG. 1*d* illustrates an electronic component where the metallic sheet is fully embedded in the package base.

The sheet 14 could alternatively be fully embedded in the package base 12, so that no part of it is within the enclosure 17. FIG. 1*d* illustrates this possibility. FIG. 1*d* also illustrates that each side-shield 161-162 may be embedded in the package base 12. In other words, the sidewalls 176-177 of the enclosure 17 are not necessarily coextensive with the side-shields 161-162. The side-shields 161-162 shield the chip from electromagnetic radiation regardless of whether or not they are placed within the enclosure 17 or embedded in the sidewalls as FIG. 1*d* illustrates.

These considerations presented above on how the metallic sheet can be fixed to the package base apply to all embodiments presented in this disclosure.

Figure 1E:
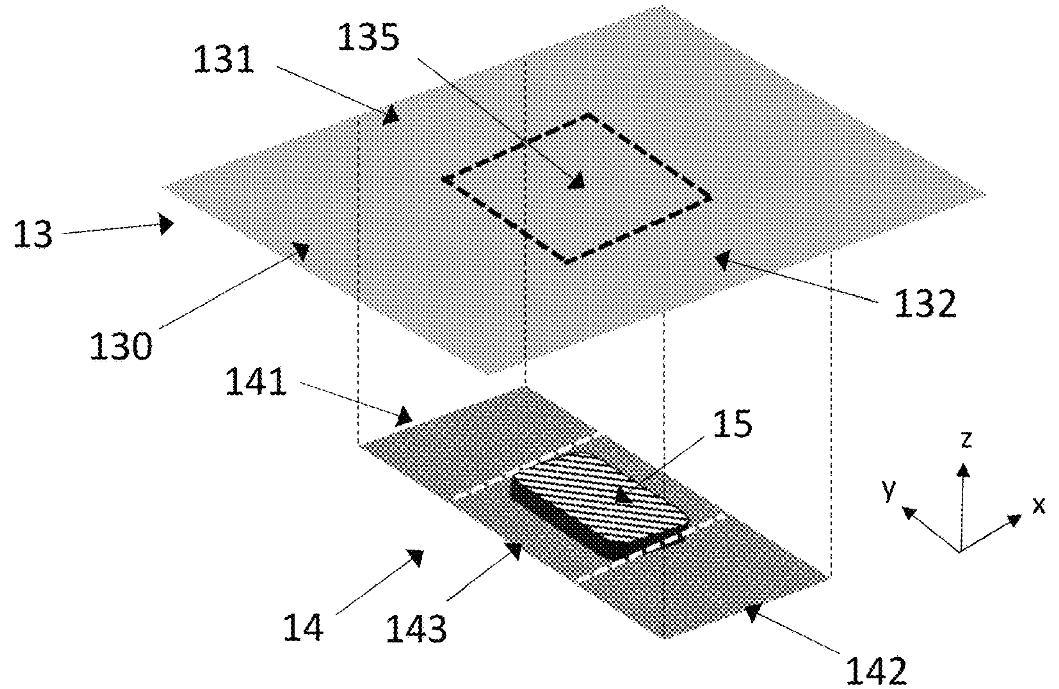
FIGS. 1*e*-1*f* illustrate schematically the cap and the metallic sheet.
Figure 1F:
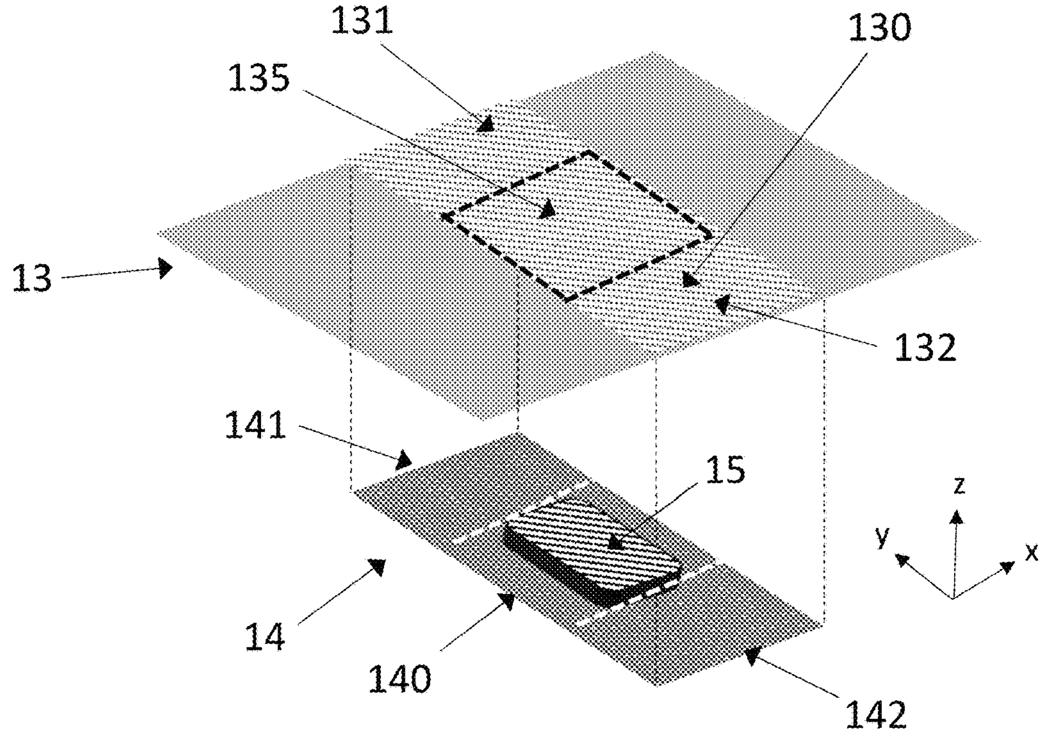

FIGS. 1*e* and 1*f* illustrate schematically the cap 13 and the metallic sheet 14 in the xyz-space (their bending in the z-direction has in this figure been omitted for clarity). FIG. 1*e* illustrates a cap 13 which is either a continuous metallic structure or an insulating structure which has been fully coated with a metallic material. In this case the entire cap forms the metallic cap section 130. The metallic cap section 130 has a central cap section 135 which overlies the chip 15, a first cap side section 131 and a second cap side section 132.

FIG. 1*f* illustrates another option where the cap 13 is formed by an insulating structure which has been partly coated with a metallic material to form a metallic cap section 130 which is shown as a patterned strip which extends across the cap. The metallic cap section has a central cap section 135 and first and second cap side sections 131-132. When the first and second sheet side sections 141-142 are bent upward and joined to the first and second cap side sections 131-132 which are bent downward, the first and second side-shields can be formed. The central cap section and the central sheet section form a top-shield and a bottom-shield, respectively, for the chip.

Figure 1G:
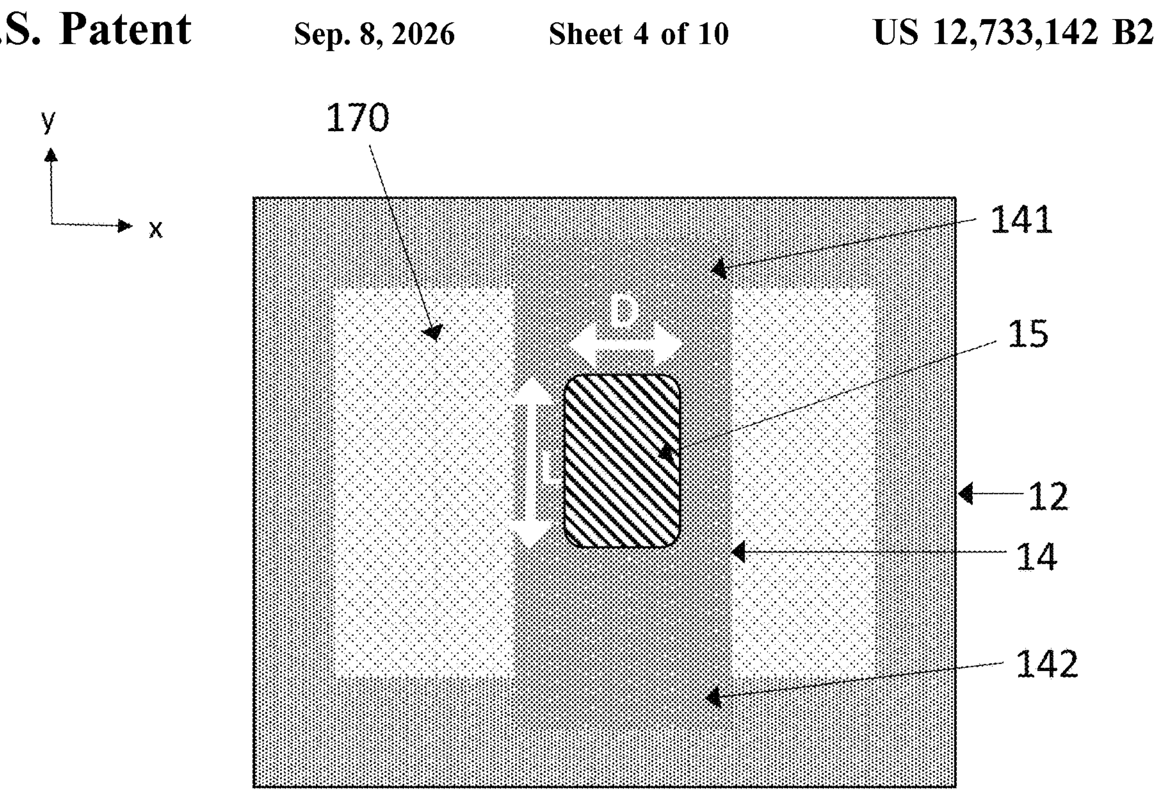
FIGS. 1*g*-1*h* illustrate the dimensions of the chip.
Figure 1H:
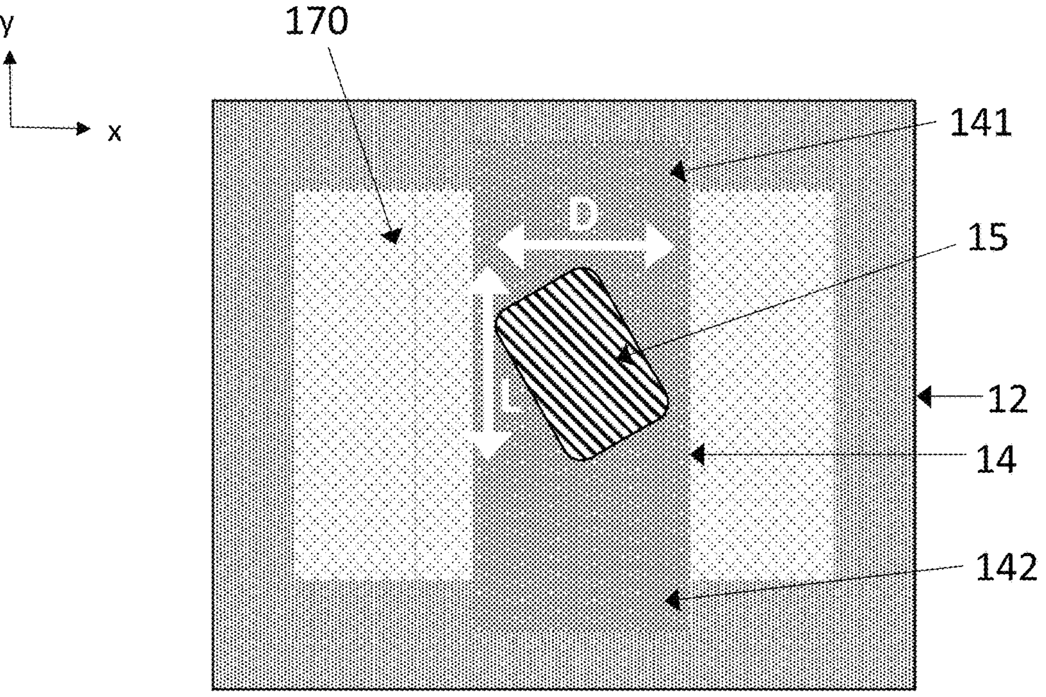

FIG. 1*g* illustrates the electronic component in the xy-plane. The cap is not illustrated. The chip has a chip length L the first direction which is parallel to the y-axis, and a chip width D in a second direction which is parallel to the x-axis. FIG. 1*h* illustrates that the edges of the chip do not necessarily have to be parallel to the first and second direction. The metallic sheet 14 and the metallic section of the cap are at least partly aligned with the chip 15 in the first direction (the y-direction). The metallic sheet 14 in this case underlies the chip 15 so that no edge of the chip 15 extends beyond the edges of the metallic sheet 14 in the xy-plane. Similarly, the metallic section of the cap may overlie the chip 15 so that no edge of the chip 15 extends beyond the edges of the metallic section of the cap in the xy-plane. These considerations apply to all embodiments presented in this disclosure.

Figure 2A:
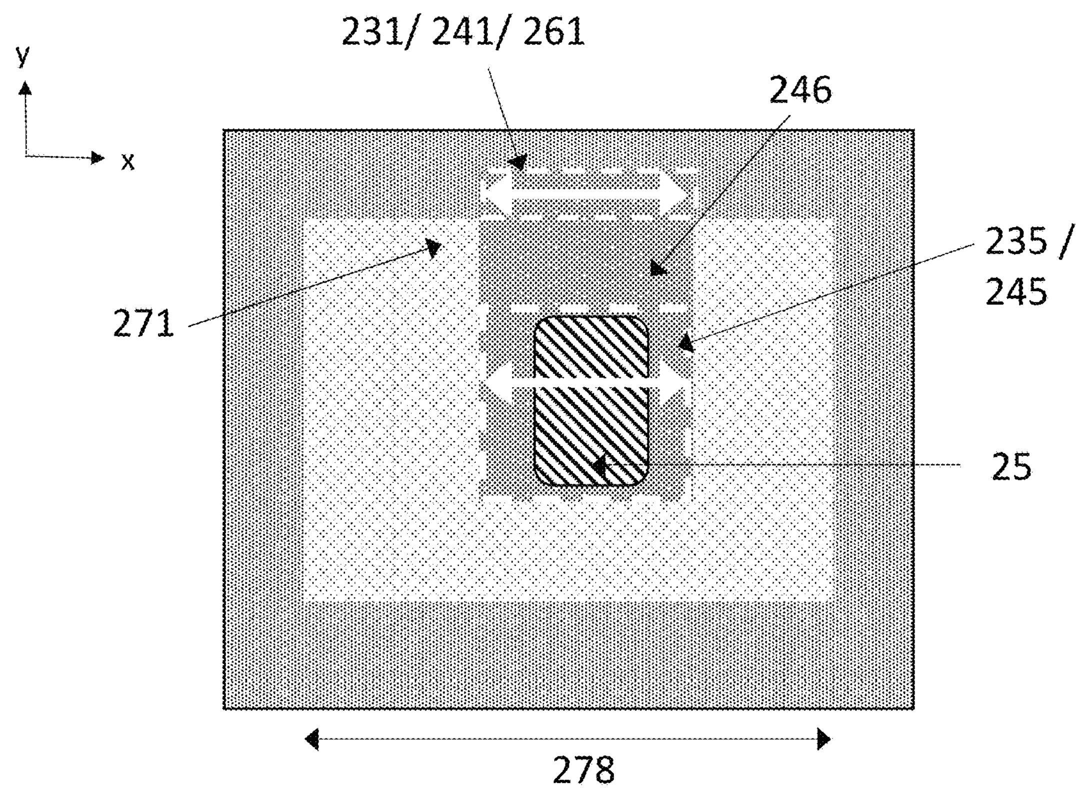
FIG. 2*a* illustrates one-sided shielding in the xy-plane.

FIG. 2*a* illustrates the device shown in in FIG. 1*a* in the xy-plane. Reference numbers 231, 235, 241, 245, 25, 261 and 271 correspond to reference numbers 131, 135, 141, 145, 15, 161 and 171, respectively, in FIG. 1*a*. The cap itself has been omitted for clarity, but the approximate region where the first sheet side section 241 and first cap side section 231 extend toward each other and form the first side-shield 261 has been indicated with a dashed white rectangle. The width of the first side-shield 261 in the second direction has been indicated with a white arrow within the rectangle. The widths of the central sheet section 245 and the central cap section 235 have also been indicated with a white arrow inside the dashed white rectangle which indicates that these sections are located above and beneath the chip 25. It can be seen in the figure that the widths of the central sheet section 245, the central cap section 235 and the first side-shield 261 in the second direction are all greater than the chip width.

In all embodiments presented in this disclosure, the widths of all top-bottom- and side shields could be as low as 10% of the chip width-even the partial shielding obtained with such widths may be sufficient for chips which are not very sensitive to electromagnetic radiation, or where only a small part of the chip is sensitive. The widths of all top-bottom- and side shields may alternatively be greater than the chip width. Maximizing protection by maximizing the width of the shields is one consideration in the design of the electronic component, but other considerations, such as the need to minimize the overall size of the electronic component, and/or the need to reserve some space for external contacts, sometimes make a narrow side-shield a better option than a wide one. The optimal widths of the side-shields and the top- and bottom-shields may also depend on how many chips and circuit boards are placed within the enclosure, where they are placed, how electrical contacts are drawn between them, and other considerations.

Although only one chip has been illustrated in the figures of this disclosure, multiple components could be protected with the same side-, top- and bottom-shields. In other words, the central sheet section could in any embodiment of this disclosure underlie two or more chips, the central cap section could overlie the same two or more chips, and each side-shield could be wider than the distance from one end of the two or more chips to the other end of the two or more chips.

FIG. 2*a* illustrates the device shown in in FIG. 1*a* in the xy-plane. Reference numbers 231-232, 235, 241-242, 245, 25, 261-262 and 271-272 correspond to reference numbers 131-132, 135, 141-142, 145, 15, 161-162 and 171-172, respectively, in FIG. 1*a*. Just as above, the approximate location of the second side-shield 262 has been indicated with a dashed white rectangle and its width in the second direction has been indicated with a white arrow inside the rectangle.

The central sheet section 245 and central cap section 235 do not necessarily have to be placed in the center of the enclosure, as in FIG. 2*a*. Their placement will depend on the placement of the chip 25 in the xy-plane. If the entire cap is metallic, as in FIG. 1*e*, then the central cap section will by definition be the part of the cap which lies above the chip 25, as FIG. 1*e* illustrated. If, on the other hand, only a part of the cap has a metallic coating, as FIG. 1*f* illustrates, then the metallic section (130) of the cap should be aligned with the chip 25 in the first direction. These options apply to all embodiments presented in this disclosure.

The metallic sheet 24 may have a rectangular shape, as FIGS. 1*e*-1*f* and 2*a*-2*b* illustrate. In this case the metallic sheet has a uniform width along its entire length (in the y-direction). Similarly, the metallic region of the cap may have a rectangular shape, as FIGS. 1*e*-1*f* illustrate, and the metallic region of the cap will then have a uniform width along its entire length. The metallic sheet 24 sheet and the metallic section of the cap may for example be between 40%-60% of the chip width along their entire length in the y-direction. The (1) width of the metallic sheet 24 in the second direction, and/or the (2) width of the metallic region of the cap in the second direction, and/or the (3) width of the first and second side-shields 261-262 in the second direction may for example be between 40-60% or 10-100% of the chip width, or they may be greater than 10%, greater than 20%, greater than 30% or greater than 40% of the chip width, or greater than one time the chip width (1×D), greater than 2×D, greater than 3×D, greater than 5×D or greater than 10×D. Furthermore, these widths may for example be between 20%-40%, between 40%-60%, between 60%-80% or between 80%-110% of the width 278 of the enclosure in the second direction. The widths (1), (2) and (3) mentioned above can all be equal, but they do not need to be equal. In other words, one of the options mentioned above could apply to (1), another (different) option could apply to (2) and a third option (different from the preceding two) could apply to (3).

Neither the metallic sheet 24 nor the metallic section of the cap must necessarily be rectangular. FIGS. 2*c* and 2*d* illustrate two optional shapes for the metallic sheet 24. In all FIGS. 2*a*-2*d*, the part of the metallic sheet 24 which is narrowest in the second direction (the x-direction) is still wider than the electronic chip 25 in the second direction. However, the metallic sheet 24 could alternatively have a shape where an intermediate sheet section 246, which lies between the central sheet section and either one of the two sheet side sections 241 and 242, is narrower in the second direction than the chip 25. This option has not been illustrated. The options discussed in this paragraph apply also the shape of the metallic section of the cap illustrated in FIG. 1*f*.

The embodiment illustrated in FIGS. 1*a* and 2*a* provide shielding for the electronic chip on one horizontal side, while the embodiments illustrated in FIGS. 1*b* and 2*b*-2*d* provide shielding on two horizontal sides which lie on opposing sides of the chip in the first direction. The directions where no shield is present can be used for other purposes, such as gaining electrical access to the chip. This has been schematically illustrated in FIG. 3, where reference numbers 32, 34 and 35 correspond to reference numbers 12, 14 and 15, respectively, in FIG. 1*b*.

Figure 3:
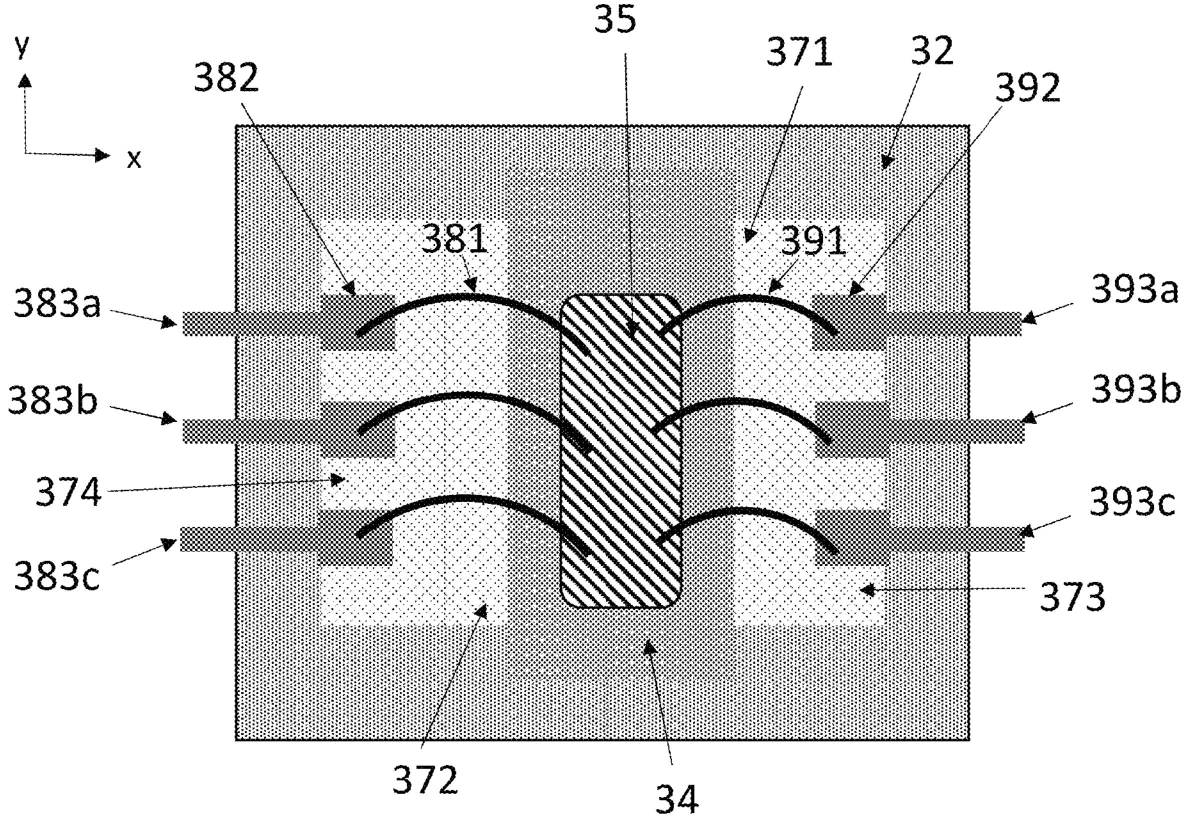
FIG. 3 illustrates how the requirements of electrical contacting may sometimes limit shielding possibilities.

FIG. 3 illustrates contact pads 382 and 392 which are attached to the package base 32 on opposing sides of the chip 35. Contact pins 383*a-c* and 393*a-c* extend to the outside of the package base 32 from the contact pads. Various contact terminals (not illustrated) on the chip 35 or on a circuit board placed inside the enclosure can be connected to contact pins for example with wire bonds 381 and 391. The contact pads and pins can for example be formed from a leadframe. They can be formed from the same leadframe as the metallic sheet 34 and embedded in the package frame in the molding process where the sheet 34 is embedded. With the arrangement illustrated in FIG. 3, the chip 35 can be shielded on the first and second sides of the enclosure 371-372 and contacted on the third and fourth sides of the enclosure 373-374.

The chip may alternatively be shielded on three or even four sides. Third and fourth side-shields could for example be formed between adjacent contact pins, for example a third side-shield between 393*a* and 393*b* and a fourths side-shield between 383*a* and 383*b*. Additional third and fourth side-shields on the third and fourth sides of the enclosure could be formed between contact pins 383*b* and 383*c* and between 393*b* and 393*c* and/or on one side of the outermost contact pins such as 383*a*, 383*c*, 393*a* and 393*c*. The widths of any third and fourth side-shield in the second direction (y-direction) may be greater than the width of any contact pin in the second direction. More generally, in the any embodiment of this disclosure, the first, second, third and/or fourth side-shield may be wider than any contact pin which extends out from the electronic component on the side of the enclosure where said side-shield is located. These options have not been separately illustrated.

Figure 4A:
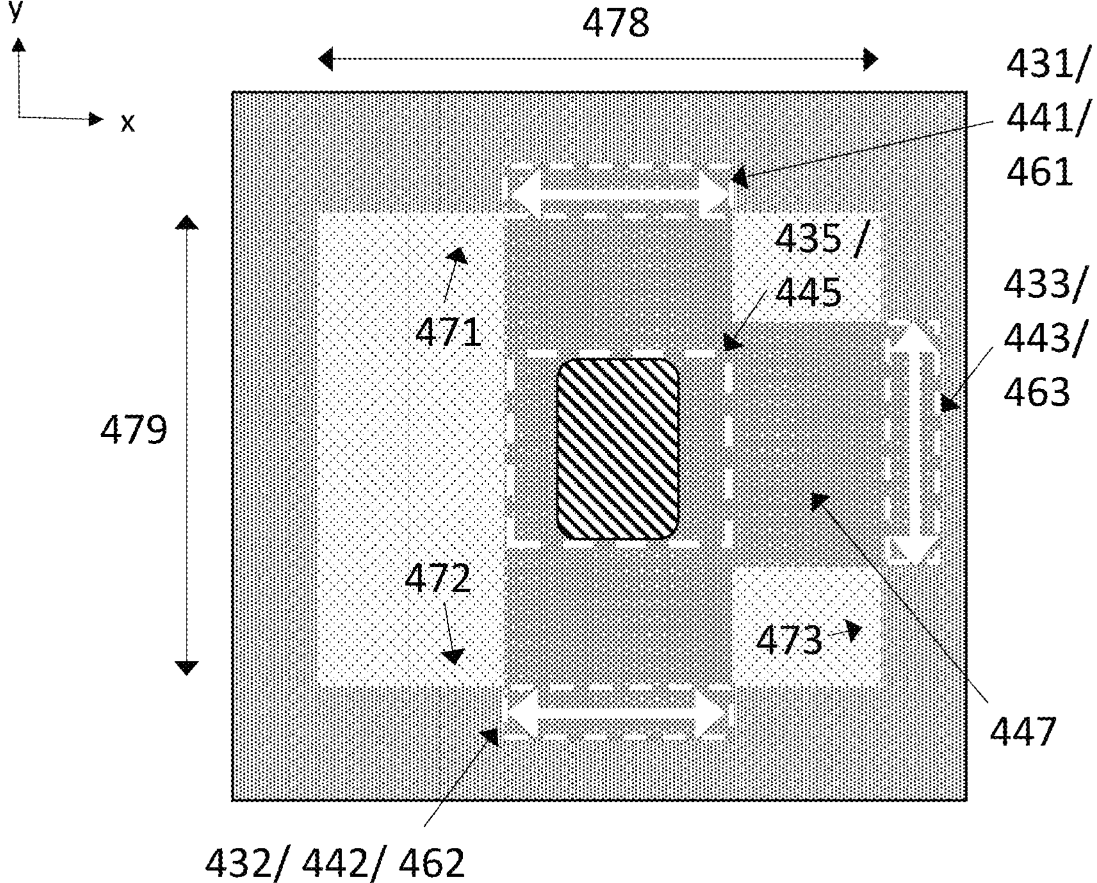
FIG. 4*a* illustrates three-sided shielding in the xy-plane.
Figure 4B:
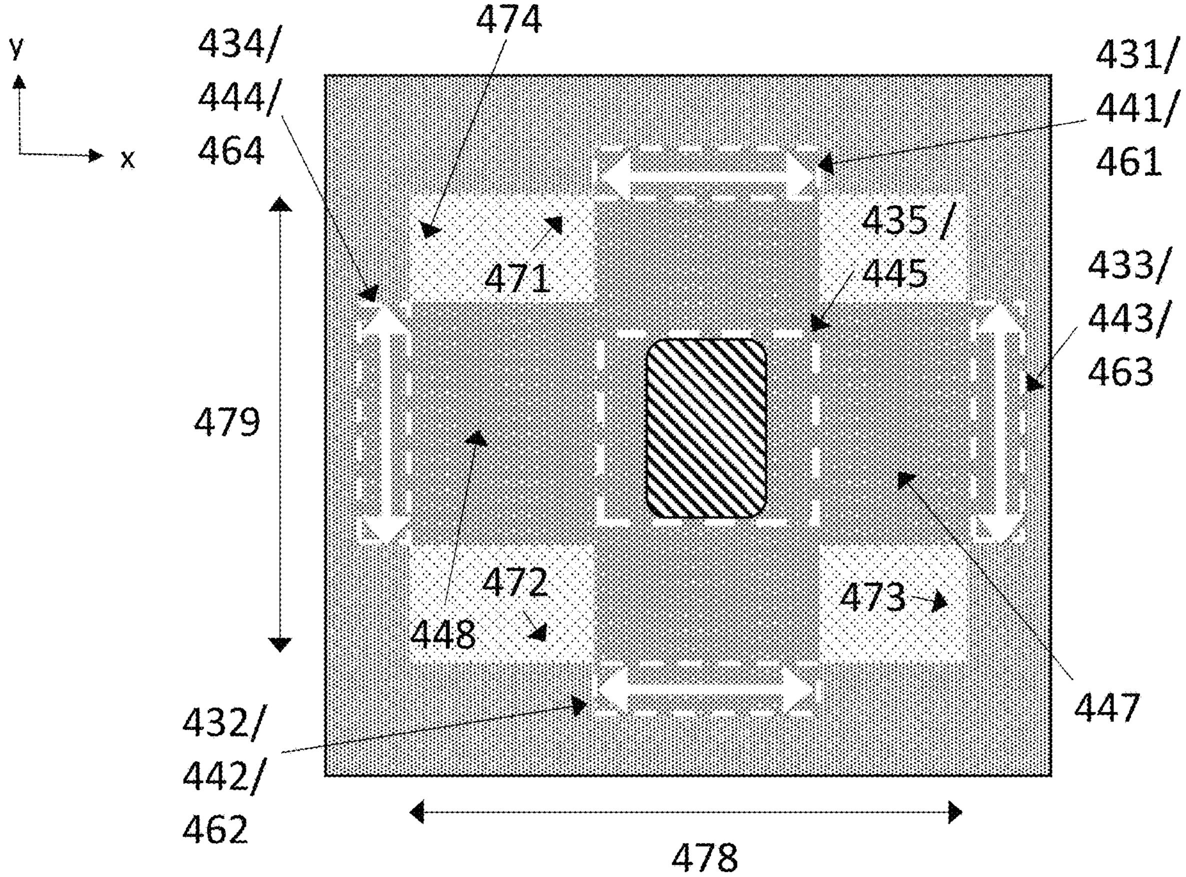
FIG. 4*b* illustrates four-sided shielding in the xy-plane.

The side shields can be wider if no contact pins are present in the component. FIGS. 4*a* and 4*b* illustrate electronic components with wide third and fourth side-shields. Reference numbers 431-432, 435, 441-442, 445, 461-462 and 471-472 correspond to reference numbers 131-132, 135, 141-142, 145, 161-162 and 171-172, respectively, in FIG. 1*b*. Reference number 478 corresponds to reference numbers 278 in FIGS. 2*a* and 2*b*. All options described above for the first and second side-shields apply in these figures also.

In FIG. 4*a* the metallic sheet also comprises a third sheet side section 443 on a third side 473 of the enclosure and the metallic sheet extends in the second direction (the x-direction) from the third sheet side section 443 to the central sheet section 445. The metallic cap section comprises a third cap side section 433 on the third side 473 of the enclosure, and the metallic cap section extends in the second direction from the third cap side section 433 to the central cap section 435. The third sheet side section 443 is in contact with the third cap side section 433 so that the third sheet side section 443 and third cap side section 433 together form a third side-shield 463 on the third side 473 of the enclosure.

FIG. 4*b* illustrates an electronic component which comprises the third side-shield 463 described above. Additionally, the component comprises a fourth sheet side section 444 on a fourth side 474 of the enclosure and the metallic sheet extends in the second direction from the fourth sheet side section 444 to the central sheet section 445. The metallic cap section comprises a fourth cap side section 434 on the fourth side 474 of the enclosure, and the metallic cap section extends in the second direction from the fourth cap side section 434 to the central cap side section 435. The fourth sheet side section 444 is in contact with the fourth cap side section 434 so that the fourth sheet side section 444 and fourth cap side section 434 together form a fourth side-shield 464 on the fourth side 474 of the enclosure.

The width of the third and fourth side-shields 463 and 464 in the first direction (the y-direction) may for example be between 40%-60% of the chip length. Alternatively, this width may in any embodiment of this disclosure be greater than 10%, greater than 20%, greater than 30% or greater than 40% of the chip width, or between 10% and 100% of the chip length.

All options described above with regard to the shape of sheet side sections 441-442 and cap side sections 431-432 and how they can be joined to each other apply also to the third and fourth sheet side sections and the third and fourth cap side sections. The third and fourth side-shields 463-464 formed by these sections may be aligned with the electronic chip in the second direction.

A third intermediate sheet section 447 connects the third sheet side section 443 to the central sheet section 445. A fourth intermediate sheet section 448 connects the fourth sheet side section 444 to the central sheet section 445. The (1) width of the third and fourth intermediate sheet sections 447-448 in the first direction, and/or the (2) width of the corresponding intermediate regions of the metallic cap section in the first direction, and/or the (3) width of the third and fourth side-shields 463-464 in the first direction may for example be between 40-60% or 10-100% of the chip length (L), or they may be greater than 10%, greater than 20%, greater than 30% or greater than 40% of the chip length, or greater than one time the chip length (1×L), greater than two times the chip length (2×L), greater than 3×L, greater than 5×L or greater than 10×L. Furthermore, these widths may for example be between 20%-40%, between 40%-60%, between 60%-80% or between 80%-110% of the width 479 of the enclosure in the first direction. The width of the third and fourth side-shields 463-464 in the first direction do not need to be equal to the width of the first or second side-shield 461-462 in the second direction. All four of these widths may be equal, or some of them may be equal, but they may also all be different.

Figure 5:
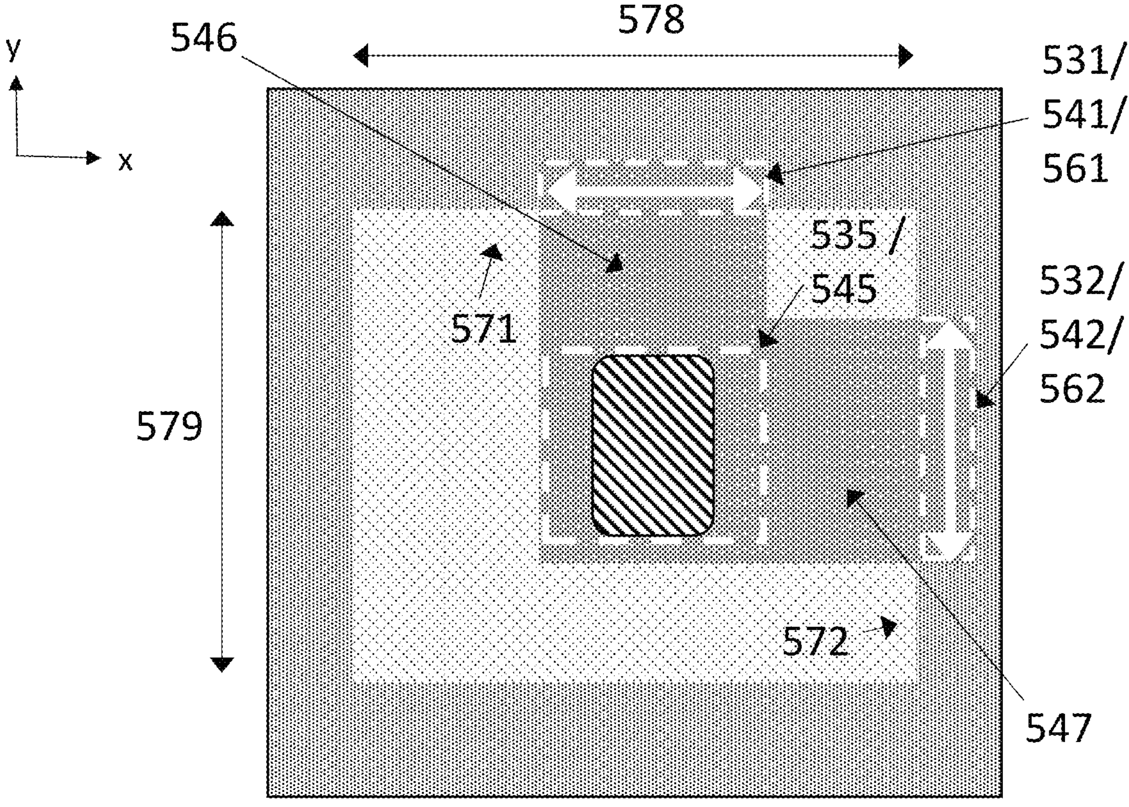
FIG. 5 illustrates a two-sided shielding where the two sides are not on opposite sides of the chip.

In some cases, it may preferable to provide side-shielding on two sides which are not opposite to each other. FIG. 5 illustrates a component where reference numbers 531, 535, 541, 545, 561 and 571 correspond to reference numbers 131, 135, 141, 145, 161 and 171, respectively, in FIG. 1*a*. Reference number 578 corresponds to reference number 278 in FIG. 2*a*. The options which were described above for the first side-shield with reference to FIGS. 2*a*-2*d* apply here also.

Figure 2B:
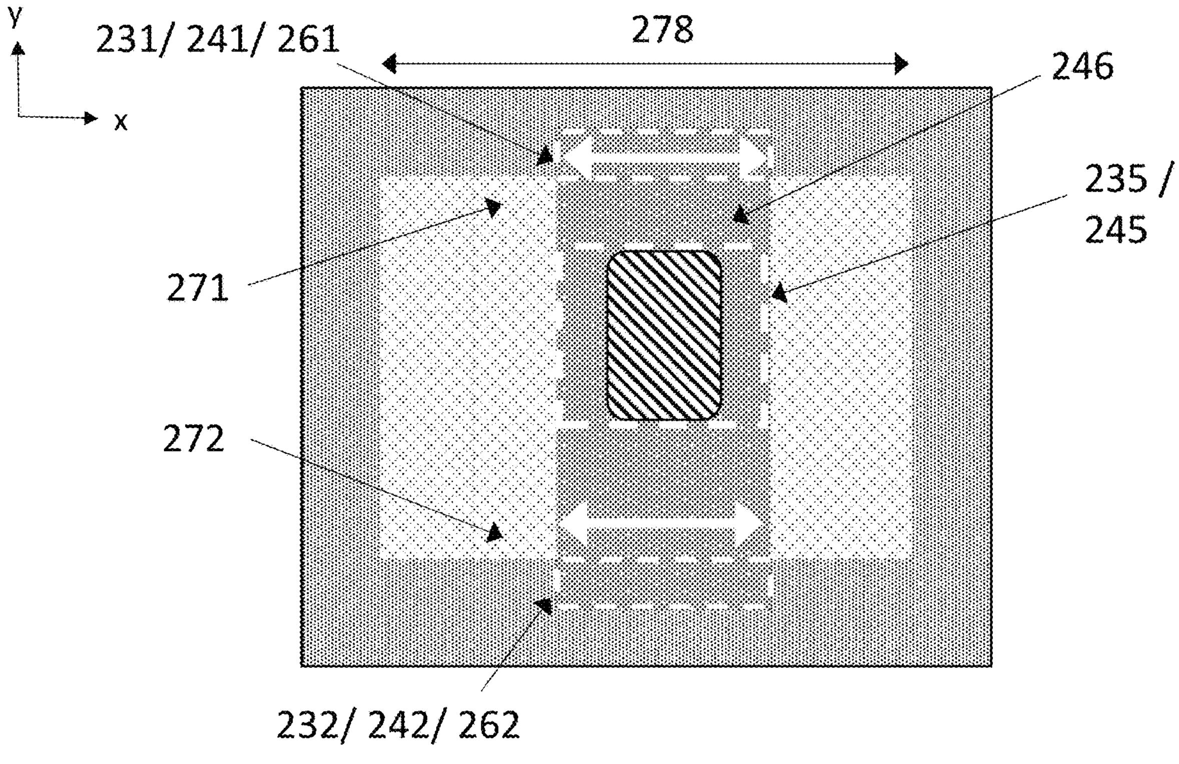
FIG. 2*b* illustrates two-sided shielding in the xy-plane.
Figure 2C:
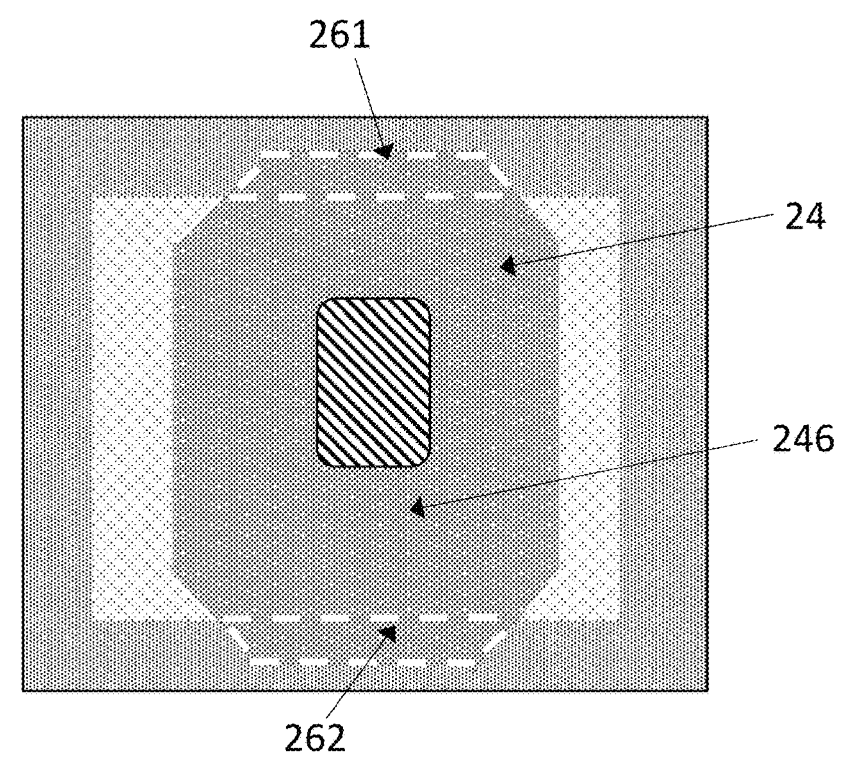
FIGS. 2*c*-2*d* illustrate alternative shapes for the metallic sheet in the xy-plane.
Figure 2D:
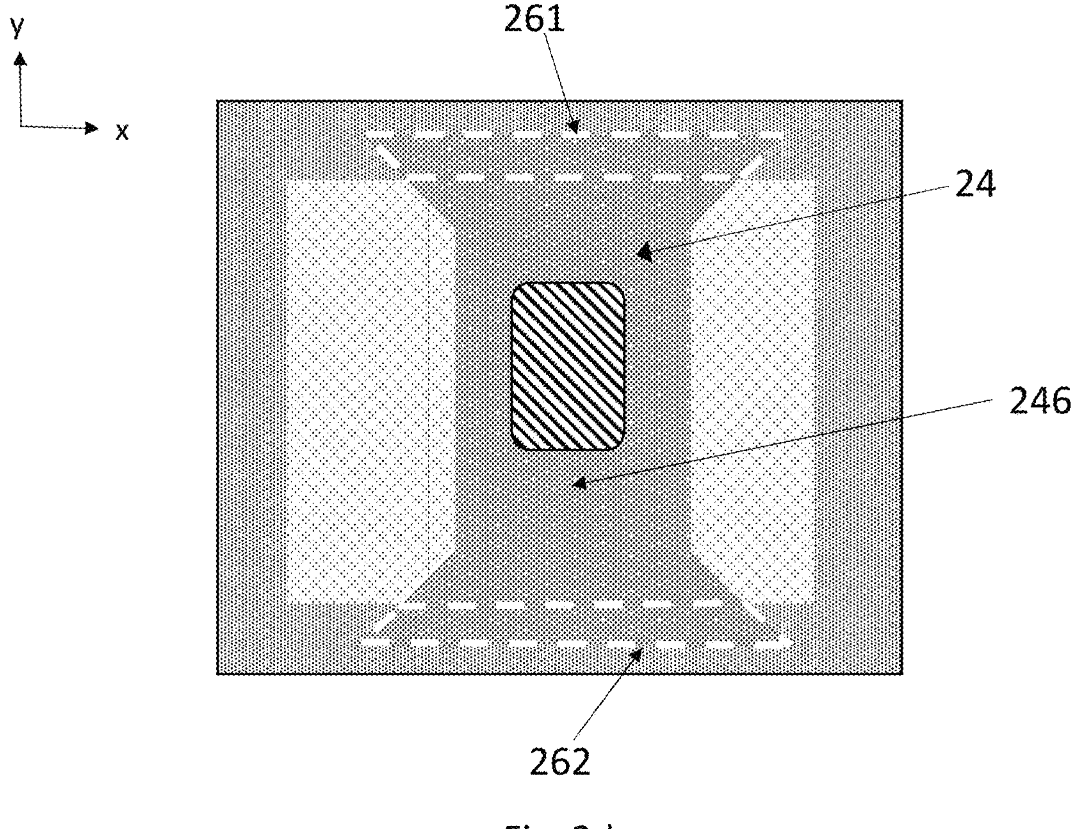

Unlike in FIG. 2*b*, for example, the second side-shield is in this case built on the right side of the component. In other words, the second side 572 of the enclosure where the second side shield 562 is located is not opposite to the first side 571. Instead, the first side-shield 561 is separated from the chip in the first direction (y-direction) and the second side-shield 562 is separated from the chip in the second direction (x-direction). This means that the metallic sheet in this case has the shape of a perpendicular corner piece.

In other words, in FIG. 5 the metallic sheet comprises a second sheet side section 542 on a second side 572 of the enclosure and the metallic sheet extends in the second direction from the second sheet side section 542 to the central sheet section 545. the metallic cap section comprises a second cap side section 532 on the second side 572 of the enclosure. The metallic cap section extends in the second direction from the second cap side section 532 to the central cap section 535. The second sheet side section 542 is in contact with the second cap side section 532 so that the second sheet side section 542 and second cap side section 532 together form a second side-shield 562 on the second side 572 of the enclosure.

As before, the width of the second side-shield 562 in the first direction the first direction (the y-direction) may for example be between 40%-60% of the chip length. Alternatively, this width may be greater than 10%, greater than 20%, greater than 30% or greater than 40% of the chip width, or between 10% and 100% of the chip length.

All options described above with regard to the shape of sheet and cap side sections apply also to FIG. 5. The second side-shields 562 may in this case be aligned with the electronic chip in the second direction.

A first intermediate sheet section 546 connects the first sheet side section 541 to the central sheet section 545. A second intermediate sheet section 547 connects the second sheet side section 542 to the central sheet section 545. The (1) width of the first and second intermediate sheet sections 546-547 in the first direction, and/or (2) the width of the corresponding intermediate regions of the metallic cap section in the first direction, and/or (3) the width of the second side-shield 562 in the first direction may for example be between 40-60% or 10-100% of the chip length (L), or they may be greater than 10%, greater than 20%, greater than 30% or greater than 40% of the chip length, or greater than one time the chip length (1×L), greater than two times the chip length (2×L), greater than 3×L, greater than 5×L or greater than 10×L. Furthermore, these widths may for example be between 20%-40%, between 40%-60%, between 60%-80% or between 80%-110% of the width 579 of the enclosure in the first direction. The width of the first side-shield 561 in the second direction does not necessarily have to be equal to the width of the second side-shield 562 in the second direction, thought it may be equal.

The invention claimed is:

1. An electronic component comprising a package base and a cap which is attached to the package base to form an enclosure, wherein the enclosure extends in a first direction and in a second direction which is orthogonal to the first, and the electronic component comprises at least one electronic chip which is mounted within said enclosure, wherein the electronic component comprises a metallic sheet which is fixed to the package base, and the metallic sheet comprises a first sheet side section on a first side of the enclosure and a central sheet section which underlies the electronic chip, and the metallic sheet extends in the first direction from the first sheet side section to the central sheet section, the cap comprises a metallic cap section which comprises a first cap side section on the first side of the enclosure and a central cap section which overlies the electronic chip, and the metallic cap section extends in the first direction from the first cap side section to the central cap section, the first sheet side section is bent upward from the central sheet section, and the first cap side section is bent downward from the central cap section, so that the contact between the first sheet side section and first cap side section is above the central sheet section and below the central cap section, and the first sheet side section is in contact with the first cap side section so that the first sheet side section and first cap side section together form a first side-shield on the first side of the enclosure.

2. The electronic component according to claim 1, wherein the package base is formed by a moulded polymer.

3. The electronic component according to claim 1, wherein the cap consists of a metal sheet which forms the metallic cap section.

4. The electronic component according to claim 1, wherein the cap comprises an insulating sheet which is fully or partly coated with a metallic coating, and the metallic cap section is the section of the insulating sheet which is coated with the metallic coating.

5. An electronic component comprising a package base and a cap which is attached to the package base to form an enclosure, wherein the enclosure extends in a first direction and in a second direction which is orthogonal to the first, and the electronic component comprises at least one electronic chip which is mounted within said enclosure, wherein the electronic component comprises a metallic sheet which is fixed to the package base, and the metallic sheet comprises a first sheet side section on a first side of the enclosure and a central sheet section which underlies the electronic chip, and the metallic sheet extends in the first direction from the first sheet side section to the central sheet section, the cap comprises a metallic cap section which comprises a first cap side section on the first side of the enclosure and a central cap section which overlies the electronic chip, and the metallic cap section extends in the first direction from the first cap side section to the central cap section, the first sheet side section is in contact with the first cap side section so that the first sheet side section and first cap side section together form a first side-shield on the first side of the enclosure, the metallic sheet comprises a second sheet side section on a second side of the enclosure and the metallic sheet extends in the first direction from the second sheet side section to the central sheet section, the metallic cap section comprises a second cap side section on the second side of the enclosure, and the metallic cap section extends in the first direction from the second cap side section to the central cap section, the second sheet side section is in contact with the second cap side section so that the second sheet side section and second cap side section together form a second side-shield on the second side of the enclosure, and the second sheet side section is bent upward from the central sheet section, and the second cap side section is bent downward from the central cap section, so that the contact between the second sheet side section and second cap side section is above the central sheet section and below the central cap section.

6. The electronic component according to claim 5, wherein the metallic sheet comprises a third sheet side section on a third side of the enclosure and the metallic sheet extends in the second direction from the third sheet side section to the central sheet section, and the metallic cap section comprises a third cap side section on the third side of the enclosure, and the metallic cap section extends in the second direction from the third cap side section to the central cap section, and the third sheet side section is in contact with the third cap side section so that the third sheet side section and third cap side section together form a third side-shield on the third side of the enclosure.

7. The electronic component according to claim 6, wherein the third sheet side section is bent upward from the central sheet section, and the third cap side section is bent downward from the central cap section, so that the contact between the third sheet side section and third cap side section is above the central sheet section and below the central cap section.

8. The electronic component according to claim 6, wherein the metallic sheet comprises a fourth sheet side section on a fourth side of the enclosure and the metallic sheet extends in the second direction from the fourth sheet side section to the central sheet section, and the metallic cap section comprises a fourth cap side section on the fourth side of the enclosure, and the metallic cap section extends in the second direction from the fourth cap side section to the central cap side section, and the fourth sheet side section is in contact with the fourth cap side section so that the fourth sheet side section and fourth cap side section together form a fourth side-shield on the fourth side of the enclosure.

9. The electronic component according to claim 8, wherein the fourth sheet side section is bent upward from the central sheet section, and the fourth cap side section is bent downward from the central cap section, so that the contact between the fourth sheet side section and fourth cap side section is above the central sheet section and below the central cap section.

10. An electronic component comprising a package base and a cap which is attached to the package base to form an enclosure, wherein the enclosure extends in a first direction and in a second direction which is orthogonal to the first, and the electronic component comprises at least one electronic chip which is mounted within said enclosure, wherein the electronic component comprises a metallic sheet which is fixed to the package base, and the metallic sheet comprises a first sheet side section on a first side of the enclosure and a central sheet section which underlies the electronic chip, and the metallic sheet extends in the first direction from the first sheet side section to the central sheet section, the cap comprises a metallic cap section which comprises a first cap side section on the first side of the enclosure and a central cap section which overlies the electronic chip, and the metallic cap section extends in the first direction from the first cap side section to the central cap section, the first sheet side section is in contact with the first cap side section so that the first sheet side section and first cap side section together form a first side-shield on the first side of the enclosure, the metallic sheet comprises a second sheet side section on a second side of the enclosure and the metallic sheet extends in the second direction from the second sheet side section to the central sheet section, the metallic cap section comprises a second cap side section on the second side of the enclosure, and the metallic cap section extends in the second direction from the second cap side section to the central cap section, the second sheet side section is in contact with the second cap side section so that the second sheet side section and second cap side section together form a second side-shield on the second side of the enclosure, and the second sheet side section is bent upward from the central sheet section, and the second cap side section is bent downward from the central cap section, so that the contact between the second sheet side section and second cap side section is above the central sheet section and below the central cap section.

* * * * *